United States Patent [19]

Kohn et al.

[11] Patent Number: 5,199,879

[45] Date of Patent: Apr. 6, 1993

[54] ELECTRICAL ASSEMBLY WITH FLEXIBLE CIRCUIT

[75] Inventors: Harold Kohn, Endwell; Kishor V. Desai, Vestal; Ronald J. Romanosky, Endwell; George J. Saxenmeyer, Jr., Apalachin; Reinhold E. Tomek, Endwell; James R. Webb, Endicott, all of N.Y.

[73] Assignee: International Business Machines Corporation, Armonk, N.Y.

[21] Appl. No.: 840,212

[22] Filed: Feb. 24, 1992

[51] Int. Cl.$^5$ .............................................. H01R 9/09
[52] U.S. Cl. ........................................ 439/63; 439/82
[58] Field of Search ...................... 439/55, 63, 78, 74, 439/75, 81, 82, 67, 77; 361/398, 401, 406, 408

[56] References Cited

U.S. PATENT DOCUMENTS

| 1,862,275 | 5/1927 | Menut . | |
|---|---|---|---|
| 3,209,066 | 9/1965 | Toomey et al. | 361/406 |
| 3,340,491 | 9/1967 | Deakin | 361/414 |
| 3,539,965 | 6/1968 | Morehart et al. . | |
| 3,573,707 | 4/1971 | Reynolds . | |
| 3,699,495 | 10/1972 | Raynor . | |
| 3,924,918 | 12/1975 | Friend . | |
| 4,593,959 | 6/1986 | Simms . | |
| 4,627,678 | 12/1986 | Biswas . | |
| 4,658,104 | 4/1987 | Koizumi et al. | 439/77 |
| 4,688,151 | 8/1987 | Kraus et al. | 361/414 |
| 4,820,171 | 4/1989 | Kortegaard . | |
| 4,867,691 | 9/1989 | Eck | 439/82 |
| 4,969,259 | 11/1990 | Macek et al. | 29/845 |
| 5,133,669 | 7/1992 | Barnhouse et al. | 439/78 |

OTHER PUBLICATIONS

IBM Technical Bulletin, Roche, vol. 6, No. 8, p. 87, Jan. 1964.
IBM Technical Bulletin, Reinhart, vol. 10, No. 12, p. 1985, May, 1968.
IBM Technical Disclosure Bulletin vol. 33, No. 5, Oct., 1990, "Flexible Circuit Interconnection System", by Saxenmeyer et al., p. 418.
IBM Technical Disclosure Bulletin, 1987, p. 1416, "Compliant Through-Hole".

Primary Examiner—Neil Abrams
Attorney, Agent, or Firm—Lawrence R. Fraley

[57] ABSTRACT

An electrical assembly which includes a first circuit member (e.g., TCM) with at least one conductive pin projecting therefrom for being frictionally and electrically engaged by a flexible portion of circuit means of a second circuit member (e.g., PCB). An opening is provided within the PCB relative to the flexible portions such that these portions project at least partly across the opening and frictionally engage respective conductive portions of the pin when inserted within the opening. Each of these flexible portions in turn is part of a circuit layer which may be coupled to respective conductive planes or the like within the PCB, while the respective conductive portions of the pin may in turn be electrically coupled to various conductive layers within/upon the TCM.

20 Claims, 3 Drawing Sheets

ELECTRICAL ASSEMBLY WITH FLEXIBLE CIRCUIT

TECHNICAL FIELD

The invention relates to electrical assemblies and particularly to such assemblies wherein a first circuit member (e.g., a circuit module) is adapted for being positioned on and electrically coupled to a second circuit member (e.g., printed circuit board). Even more particularly, the invention relates to such circuit assemblies wherein this first circuit member includes a plurality of pins for being positioned within the second, receiving circuit member in order to accomplish the electrical coupling thereto.

BACKGROUND OF THE INVENTION

Electrical assemblies wherein circuit members such as thermal conduction modules (TCM's) are positioned on a larger, receiving second circuit member such as a multilayered printed circuit board are well known in the art. Typically, such TCM's include a ceramic member having at least one and preferably a plurality of individual layers of conductive circuitry therein/thereon, which circuitry in turn is selectively electrically connected to individual pins (e.g., copper) which project from one of the TCM's external surfaces. These conductive pins in turn are typically inserted within a receptive opening, such as a plated-through-hole (PTH) formed within the multilayered printed circuit board (PCB). Also typical, this multilayered PCB will in turn include a plurality of conductive layers (also known as conductive planes) therein which may be selectively connected to individual ones of the PTH's, depending on the operational requirements of the completed assembly. Such conductive planes, and layers of circuitry in the TCM serve to provide signal, power and/or ground functions, again depending on the assembly's operational requirements.

Electrical assemblies of the above described variety have found widespread utilization within the information handling systems (computer) field.

The present invention as defined herein provides an enhanced version of such an electrical assembly wherein higher density connections are possible over electrical assemblies such as defined above, such connections being attainable in a sound, effective manner. The assembly as defined herein is able to achieve such higher density without an increase in pin density over such known assemblies while simultaneously substantially reducing pin-to-pin electrical "cross-talk" (interference). Of further significance, the invention eliminates the need for individual electrical contacts typically required for placement within the aforementioned PTH's or similar apertures within the receiving printed circuit board, which contacts receive the male pin therein. Accordingly, the present invention provides a substantial cost savings over many of the above, known electrical assemblies which have heretofore required such pluralities of electrical contacts as part thereof.

It is believed that an electrical assembly possessing the above several advantageous features and others discernible from the teachings herein would constitute a significant advancement in the art.

DISCLOSURE OF THE INVENTION

It is, therefore, a primary object of the present invention to enhance the electrical assembly art and particularly such art wherein pinned circuit members are positioned in and electrically coupled to receiving circuit members.

It is another object of the invention to provide such an assembly with increased circuit density over known such assemblies.

It is yet another object of the invention to provide such an enhanced assembly which can be produced using mass production techniques, and is thus able to benefit from the several advantages (e.g., reduced cost) thereof.

In accordance with one aspect of the invention, there is provided an electrical assembly which comprises a first circuit member including a circuitized substrate and at least one (and preferably several) conductive pins projecting from the substrate, and a second circuit member for being electrically coupled to the first circuit member and including a dielectric substrate having an opening therein and circuit means located on or within the dielectric substrate and including at least one flexible portion which extends at least partly across the opening for frictionally and electrically engaging the conductive pin when positioned within the second circuit member's opening. Such frictional and electrical engagement serves to provide electrical coupling between the first and second circuit members.

BEST MODE FOR CARRYING OUT THE INVENTION

For a better understanding of the present invention, together with other and further objects, advantages and capabilities thereof, reference is made to the following disclosure and appended claims in connection with the above-described drawings.

Figure 1:
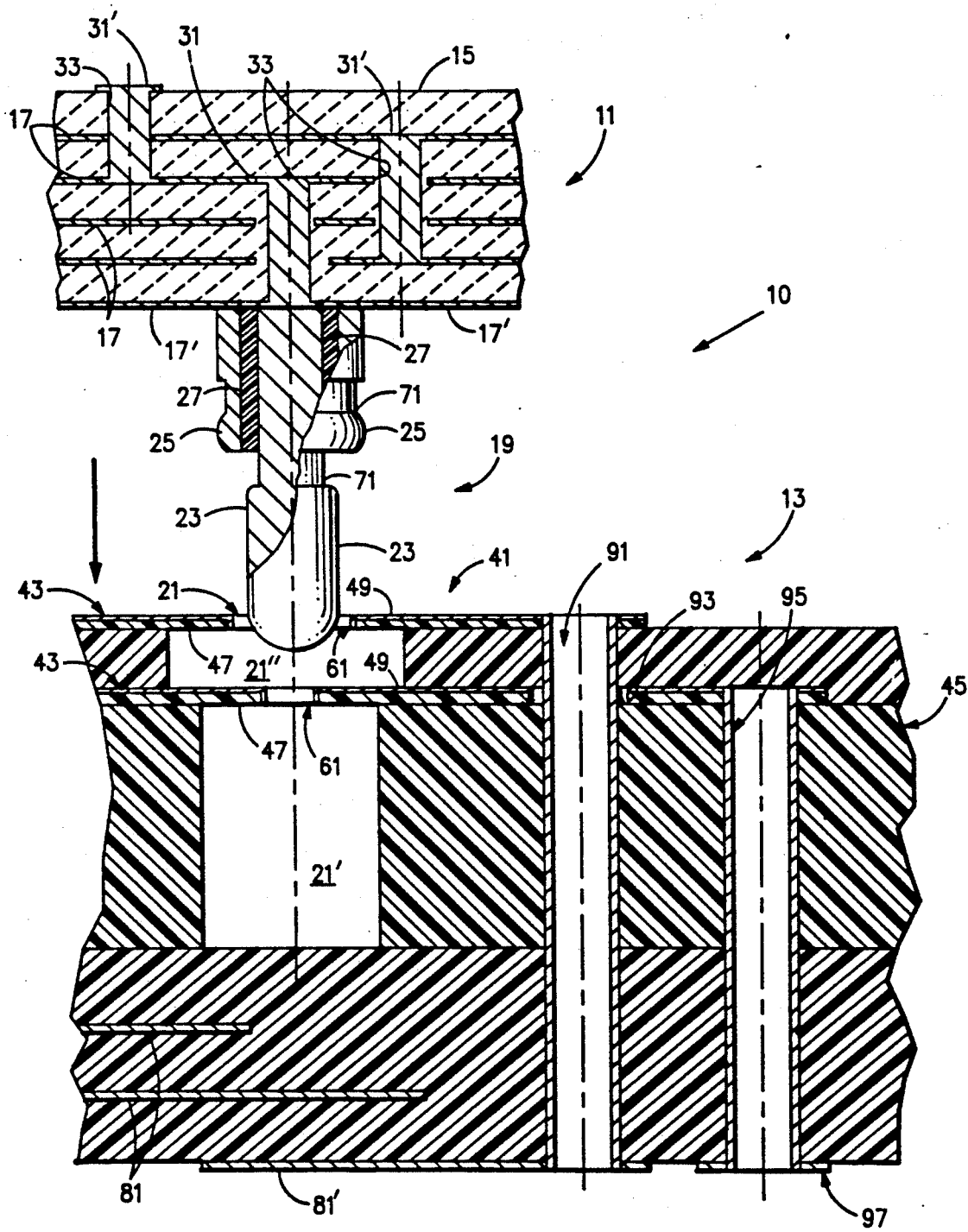
FIG. 1 is a partial elevational view, in section and on a much enlarged scale, of an electrical assembly in accordance with one embodiment of the invention, illustrating the assembly's first circuit member about to be positioned within the invention's second circuit member.
Figure 2:
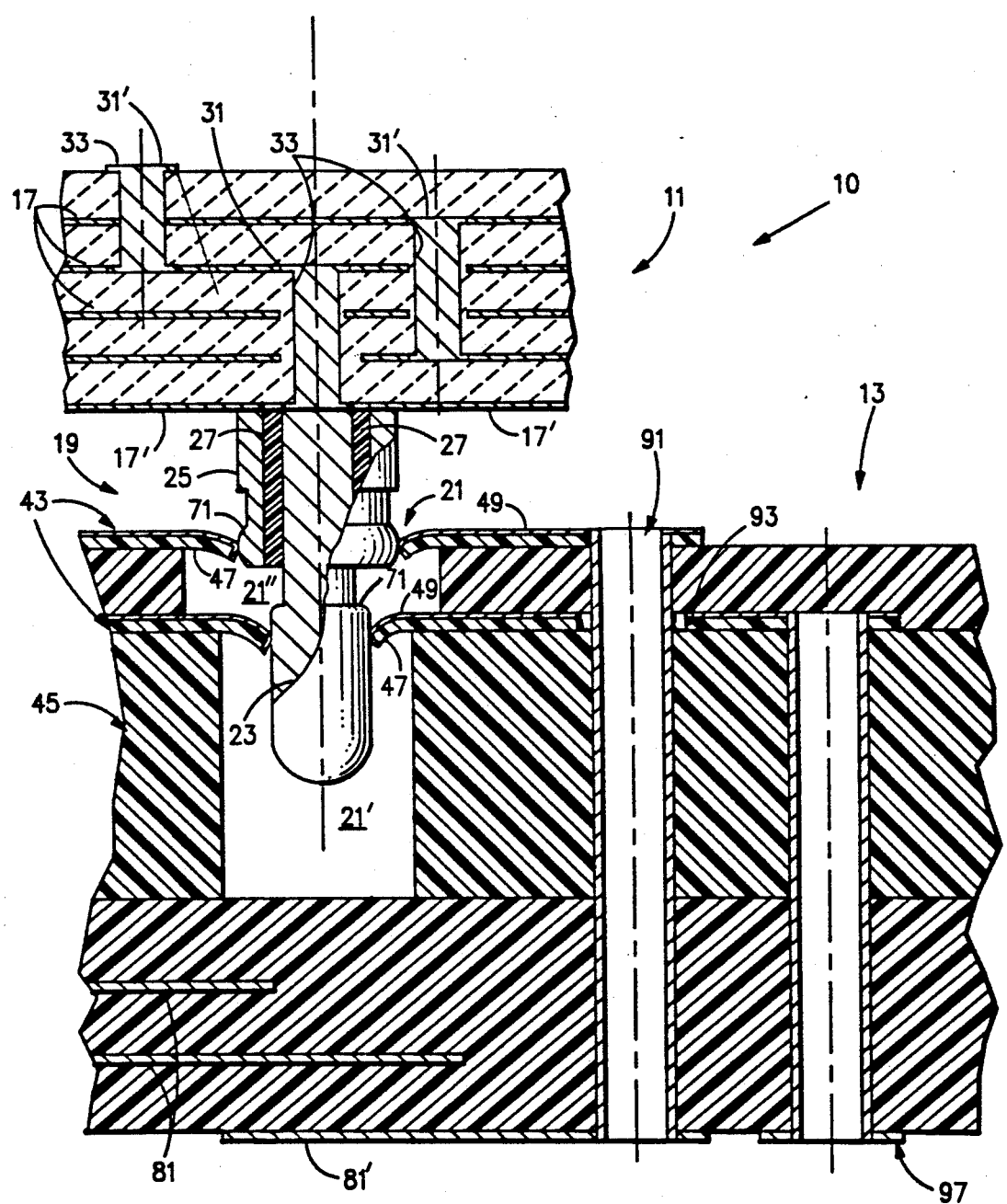
FIG. 2 is a partial elevational view, in section, showing the assembly of FIG. 1 as assembled.

In FIGS. 1 and 2, there is shown an electrical assembly 10 in accordance with one embodiment of the invention. Assembly 10 includes a first circuit member 11 designed for being positioned within and electrically coupled to a second circuit member 13. First circuit member 11 is preferably a thermal conductive module (TCM) including a dielectric (e.g., ceramic) portion 15 having therein a plurality of layers of circuitry 17 which function as signal, ground and/or power layers, depending on the operational requirements for assembly 10. First circuit member 11 further includes at least one conductive pin 19 which projects from an undersurface of the dielectric portion 15 and is designed for being inserted within a receiving opening 21 formed within second circuit member 13. In a preferred embodiment, first circuit member 11 includes a plurality of pins 19, and more preferably, from about 16 to about 3,800 such elements, but may include more, depending on operational requirements. In such an example, dielectric portion 15 preferably possesses an overall thickness of from about 0.125 inch to about 0.375 inch, with each of the layers of circuitry 17 possessing a thickness of from about 0.001 inch to about 0.003 inch.

Although member 11 is shown to include only four internal layers of circuitry 17, it is understood that the invention is not limited to this number in that several additional such layers may be successfully utilized, again depending on the operation requirements for the invention. As stated, the preferred dielectric material for portion 15 is ceramic, several examples of which are known in the TCM art and further description is not believed necessary. The preferred layers of circuitry are copper and thus also of a conductive material known in the art. Such circuitry may be provided in accordance with known techniques. Although circuit member 11 is only partially shown in FIGS. 1 and 2, it is understood that the illustrated segmented sides extend outwardly and are preferably planar at the edge portions thereof. In one example, the first circuit member possessed an overall width of about four inches and a corresponding length of about four inches. This rectangular, box-like configuration is not meant to limit the invention, in that others are, of course, acceptable.

In addition to the defined layers of circuitry 17 located internally of member 11, the member as shown in FIGS. 1 and 2 also preferably includes at least one external layer of circuitry 17' located on the same external surface of the member's dielectric body as pin 19.

In accordance with the teachings herein, pin 19 includes first and second conductive portions 23 and 25, respectively. Portion 23 is substantially cylindrical and projects a preferred distance of about 0.125 inch from the undersurface of member 11, such as shown in FIGS. 1 and 2. Similarly, the second conductive portion 25 of pin 19 is, as shown, coaxially positioned about the upper part of the first conductive portion 23 and separated therefrom, physically and electrically, by a layer of electrically insulative material 27. Layer 27 and second conductive portion 25, as shown, are both also substantially cylindrical and lie about the internally located, cylindrically shaped first conductive portion 23. In such an arrangement, the preferred conductive material for pin 19 comprises a copper-nickel alloy, while the layer of insulative material 27 is preferably polyimide. Dimension-wise, pin 19 possesses an overall outer diameter (about second conductive portion 25) of about 0.045 inch, while the first conductive portion, also cylindrical, possesses an overall outer diameter of about 0.020 inch at the largest section thereof.

As seen in FIGS. 1 and 2, first conductive portion 23 is electrically coupled to a respective one of the internal layers of circuitry 17 by a column of metallic material 31 which, in a preferred embodiment, is solder. A preferred solder for column 31 is 63:37 tin:lead, a solder known in the art. During the manufacture of member 11, apertures 33 are formed within the member's dielectric 15 at desired locations and solder material is thereafter added to provide desired electrical connections as shown. Such solder connections may be formed from the member's outer surface to a prescribed depth within the member's dielectric, or as also shown in FIGS. 1 and 2, between designated internal layers of circuitry 17 to provide interconnection therebetween.

In addition to the central column of solder 31, two additional such columns are also shown in the drawings and represented by the numerals 31'.

The first conductive portion 23 is, as shown, electrically coupled to a corresponding layer of circuitry 17 through the centrally located solder column 31 in FIGS. 1 and 2. Pin 19 is preferably soldered or brazed to this column using known techniques and further description is not believed necessary. Additionally, the outer second conductive portion 25 is electrically coupled to the respective external layer of circuitry 17', also preferably using a known solder or brazing technique. It is thus seen that the outer, second conductive portion 25 is electrically coupled to a layer of circuitry separate from that layer coupled to the internal, first conductive portion 23. In such an example, the outer conductive circuitry 17' may function as a ground or power layer (e.g., to thus electrically ground the outer part of pin 19).

Significantly, utilization of two separate conductive portions for pin 19, in combination with electrically coupling of these portions to separate layers of circuitry within member 11, serves to substantially increase the density for such a member 11, particularly when several additional pins such as described above are utilized. The invention provides this significant advantage while utilizing conductive pins which in turn may be of substantially the same overall outer diameter as singular conductive pins of the prior art. Of further significance, utilization of a pin of the construction defined herein serves to substantially reduce electrical "cross-talk", delta I noise, and other adverse electrical characteristics during operation of the invention. This is also deemed to constitute a significant advantage over multi-pin assemblies such as known in the prior art.

Figure 4:
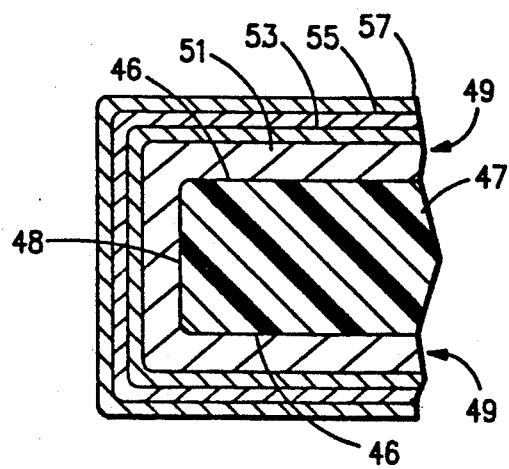
FIG. 4 is a much enlarged, partial sectional view of a terminal end of a flexible portion of the second circuit member's flexible circuit means, in accordance with one embodiment of the invention.

Second circuit member 13 includes circuit means 41 in the form of at least one circuitized element 43 located on or within the dielectric substrate 45. In a preferred embodiment, two circuitized elements, as shown in FIGS. 1 and 2, are utilized. It is to be understood, however, that in the broader aspects of the invention, only one such element may be provided. Each circuitized element 43 preferably comprises a dielectric layer 47 with at least one conductor layer 49 located thereon. See also FIG. 4. In a preferred embodiment, as shown in FIG. 4, conductor layer 49 is located on at least two opposing sides 46 of the relatively planar dielectric layer (as well as along the outer edge 48) and includes first, second, third and fourth conductor layers 51, 53, 55 and 57, respectively. In one example, dielectric layer 47 is comprised of polyimide and possesses a thickness of about 0.002 inch. The conductor layers preferably possess a total thickness of only about 0.0005 inch and are comprised of copper, nickel, a nickel alloy (e.g., palladium-nickel), and a precious metal (e.g., gold), respectively. The purpose of the additional nickel and nickel alloy layers is to act as a diffusion barrier so that the final gold plating will not diffuse into the copper. These two layers also provide the primary spring properties for this flexible element. The purpose of the precious metal layer is to provide enhanced connection to the conductive pin 19 when elements 43 engage same.

Significantly, each of the circuitized elements 43 of circuit means 41 includes a flexible portion 61 which extends at least partly across opening 21 provided within the second circuit member's dielectric substrate 45. This opening 21, as shown, is preferably substantially cylindrical and may include two different diameters, as shown. Additionally, the lower portion 21' of opening 21 is preferably of a greater depth within substrate 45 than the wider, upper portion 21". In a preferred embodiment, upper portion 21" includes a diameter of 0.070 inch while lower portion 21' possesses a diameter of 0.050 inch. Portion 21" extends a depth of 0.020 inch within member 43 while portion 21' extends a depth of 0.070 inch.

Figure 3:
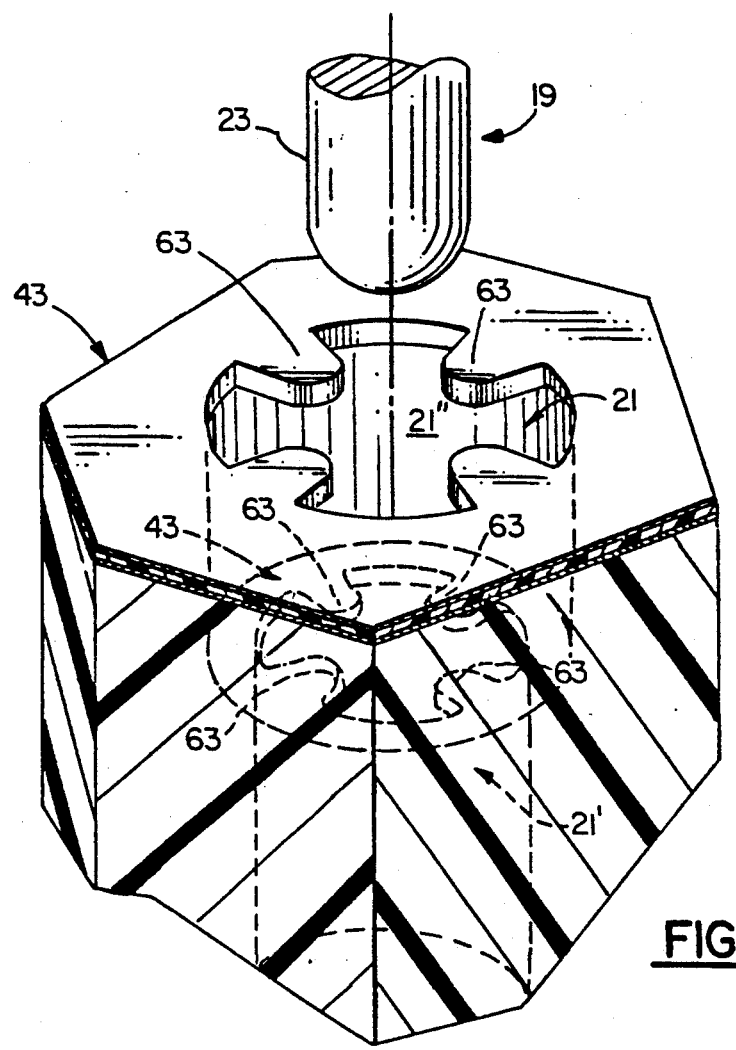
FIG. 3 is a perspective view of the invention's second circuit member in accordance with one embodiment of the invention.

As shown in FIG. 3, each flexible portion 61 includes a plurality (e.g., four) of tabs 63 which project across at least part of the respective portion of opening 21 located thereunder. That is, the tabs 63 of the upper circuitized element 43 extend partly across the upper, wider portion 21" while the tabs 63 (shown hidden in FIG. 3) of the lower circuitized element 43 (also shown hidden) extend partly across the lower, lesser diameter portion 21' (also hidden). It is also seen in FIGS. 1-3 that the opening provided by the upper circuitized element 43 between the inwardly projecting tabs 63 is substantially larger than the corresponding opening provided between the lower tabs 63. This is to allow the smaller diameter forward portion of pin 19 to pass through the upper circuitized element without engagement by tabs 63 thereof. Accordingly, this smaller diameter projecting portion will frictionally and electrically engage only the lower tabs 63 substantially within the smaller diameter, lower portion 21' of opening 21, as best seen in FIG. 2. Concurrently, the larger diameter upper portion of pin 19 (the outer conductor 25) will engage the upper tabs 63 of upper circuitized element 43. More specifically, the described conductor layer(s) 49 of the flexible portion 61 of each circuitized element will engage, concurrently, a respective conductive portion of pin 19 to provide the unique, dual form of electrical connection shown therein. It is understood that engagement by the flexible portions (tabs) of each circuitized element causes downward depression of the respective flexible portions, to the extent shown in FIG. 2. Further, this frictional connection results in a "locking" of the pin in position such that removal thereof from the second circuit member is substantially prevented. Should such removal be desired, the pin may be further inserted within the respective opening 21 until the flexible end portions 61 engage respective rounded edges 71, whereupon release (withdrawal) of pin 19 may occur.

It is understood that the tabs 63 of each flexible portions 61 include the described conductor layer(s) on both upper and lower surfaces thereof, as well as on the end (or edge) surface thereof (FIG. 4), to thereby assure positive connection with the metallic outer surfaces of the respective portions of pin 19. Such metal-to-metal type of contact (where a relatively sharp edge of each tab engages a respective side of the pin) further assures the described locking of the pin in the frictional manner defined herein. As stated, pin 19 is preferably of a copper-nickel alloy, several types of which are known in the art. Use of four inwardly projecting tabs in the arrangement shown herein (especially FIG. 3) further assures the described locking type of engagement with pin 19. Preferably, four such tabs are utilized, but the invention is not limited to this number. At a minimum, two such tabs are preferred.

As further seen in FIGS. 1 and 2, second circuit member 13 may include additional conductive planes 81 therein. As stated above, second circuit member 13 is preferably a multilayered printed circuit board (PCB). Such boards, as known, include a plurality of layers of dielectric (e.g., epoxy resin reinforced with fiberglass, also known in the art as FR-4 material) separated by various conductive planes which in turn may function as signal, power and/or ground elements. Two such planes are represented internally of the circuit member, as shown in FIGS. 1 and 2. Additionally, another conductive plane 81' may be located on an external surface of the circuit member, as also shown in FIGS. 1 and 2. In a preferred embodiment of the invention, each of the circuitized elements 43 is electrically coupled to at least one additional conductive plane within circuit member 13. In the embodiment of FIGS. 1 and 2, the upper circuitized element 43 is electrically coupled to the conductive plane 81' to thus provide an electrical path from one of the signal conductors 17 in first member 11, through pin 19 (conductive portion 23), the upper element 43, and through a plated conductive aperture 91 formed within member 13. In a preferred embodiment, conductive aperture 91 is a plated-through-hole (PTH) formed within member 13 in accordance with known techniques. Typically, such conductive apertures are drilled within the substrate during formation thereof and thereafter plated with a sound layer of conductive material (e.g., copper). This conductive material is then electrically connected (e.g., soldered) to the respective circuitized element 43, again using acceptable soldering techniques. Significantly, the conductive aperture 91 shown to the right in FIGS. 1 and 2 passes through a clearance hole 93 provided within the lower circuitized element so as not to be electrically coupled thereto. Such a hole may be provided within lower element 43 during formation thereof, prior to positioning on the dielectric as shown. The lower circuitized element 43 is electrically connected, similarly to the conductive aperture 91 to upper circuitized element 43, to a second conductive aperture 95 which in turn is electrically coupled to an outer conductive portion 97 (e.g., contact pad or the like).

It is further understood that additional connections may be provided to the various elements of the invention (e.g., by using a male pin positioned within one or both of the circuitized apertures 91 and 95). Such additional connections may be desired to connect added components, including, for example, another circuit member such as a TCM or the like having pin constructions of the known prior art.

Second circuit member 13 is formed, as stated, using known PCB manufacturing techniques. Although the individual dielectric layers shown in the embodiment of FIGS. 1 and 2 are of different thicknesses, this is not meant to limit the invention in that such layers may be of substantially similar thicknesses. Further, it is also possible to utilize different dielectric materials for the upper two layers having a respective one of the circuitized elements 43 formed thereon. That is, it is possible to form the lower, multiplane portion of circuit member 13 (that portion containing the various conductive planes 81 therein) utilizing known PCB techniques and thereafter adding, individually, the respective dielectric layers designed to accommodate circuitized elements 43. Such additional layers may be added using known techniques (e.g., adhesive) and further description is not believed necessary. Once these two additional layers have been added, then the conductive apertures 91 may be provided (e.g., drilled and plated) within the composite structure. Alternatively, the conductive aperture 95 may be provided following the addition of the first of these added layers (for the lower circuitized element 43), following which this conductive aperture is connected (e.g., soldered) to said circuitized element. Thereafter, the upper dielectric layer and upper circuitized element 43 may then be added, following which the conductive aperture 91 is provided and connected (e.g., soldered) to the upper element 43.

To assure a predetermined depth of insertion of pin 19, spacer elements (not shown) may be provided on the upper surface of circuit member 13 or secured to the lower surface of member 11. Further, the two circuit members 11 and 13 may be positioned within a suitable housing or frame structure containing appropriate means (not shown) for holding the lower circuit member 13 and for defining the accurate positioning depth of the upper circuit member 11. Further description of these various additional members for use with the invention is not believed necessary.

Thus there has been shown and described an electrical assembly which provides high density connections using conductive pins which are inserted within one of the assembly's circuit members and coupled to a flexible portion of the lower circuit member's circuit means. In a preferred embodiment, the circuit means includes at least two flexible portions and the corresponding pin includes at least two separate conductive portions, each conductive portion designed for being frictionally and electrically connected to a respective one of the flexible portions. Thus, at least two different electrical connections are attainable with a singular pin insertion. The defined pin construction, including at least two conductive portions separated by a common layer of insulative material and coupled to a ground layer in the manner defined, serves to substantially prevent electrical crosstalk or other adverse electrical problems during assembly operation. The assembly is also adaptable for being produced using many known processing techniques and is also capable of being produced on a relatively large scale. As further defined, the electrical assembly eliminates the need for additional female contact pins or the like located within conductive apertures (e.g., PTH's) as are required in many prior art electrical assemblies. The invention thus represents a significant cost advantage to such prior assemblies.

While there have been shown and described what are at present considered the preferred embodiments of the present invention, it will be obvious to those skilled in the art that various changes and modifications may be made therein without departing from the scope of the invention as defined by the appended claims.

What is claimed is:

1. A electrical assembly comprising:
a first circuit member including a circuitized substrate having first and second layers of circuitry as part thereof and at least one conductive pin projecting from said substrate and including first and second conductive portions electrically coupled to said first and second layers of circuitry, respectively, said second conductive portion being coaxially positioned about said first conductive portion to substantially reduce electrical interference between said pin and adjacent pins during operation of said assembly; and
a second circuit member for being electrically coupled to said first circuit member and including a dielectric substrate having an opening therein and circuit means located on or within said dielectric substrate and including first and second flexible portions extending at least partly across said opening at spaced-apart locations therein, said first and second flexible portions of said circuit means adapted for frictionally and electrically engaging said first and second conductive portions of said conductive pin, respectively when said pin is positioned within said opening of said second circuit member to provide said electrical coupling between said first and second circuit members.

2. The electrical assembly of claim 1 wherein said circuitized substrate includes a dielectric portion, said dielectric portion being comprised of ceramic.

3. The electrical assembly of claim 1 wherein said first layer of circuitry comprises a signal layer and said second layer of circuitry comprises a power or ground layer.

4. The electrical assembly of claim 1 further including a solder column, said solder column electrically coupling said first conductive portion of said pin to said first layer of circuitry of said first circuit member.

5. The electrical assembly of claim 1 wherein said first and second conductive portions of said conductive pin each include outer rounded edges, said first of said flexible portions being adapted for engaging the outer rounded edges of said first conductive portion of said pin and said second of said flexible portions being adapted for engaging the outer rounded edges of said second conductive portion of said pin when said pin is positioned within said opening to enable withdrawal of said pin from said opening.

6. The electrical assembly of claim 5 wherein each of said first and second flexible portions of said circuit means comprises a plurality of tabs, each of said tabs adapted for frictionally and electrically engaging said conductive pin.

7. The electrical assembly of claim 6 wherein the number of said tabs of each of said first and second flexible portions is four.

8. The electrical assembly of claim 1 further including a layer of electrically insulative material located between said first and second conductive portions of said conductive pin.

9. The electrical assembly of claim 8 wherein said electrically insulative material is polyimide.

10. The electrical assembly of claim 1 wherein said first and second conductive portions of said conductive pin are comprised of a copper-nickel alloy.

11. The electrical assembly of claim 1 wherein said flexible portion of said circuit means comprises a dielectric layer having at least one conductive layer thereon, said conductive layer frictionally and electrically engaging said conductive pin.

12. The electrical assembly of claim 11 wherein said dielectric layer of said flexible portion is comprised of polyimide.

13. The electrical assembly of claim 11 wherein said conductor layer of said flexible portion is comprised of copper.

14. The electrical assembly of claim 11 including at least two conductor layers on said flexible portion, a first of said conductor layers being comprised of copper and a second of said conductor layers being comprised of nickel.

15. The electrical assembly of claim 11 including at least three conductor layers on said flexible portion, a first of said conductive layers being comprised of copper, a second of said conductor layers being comprised of nickel, and a third of said conductor layers being comprised of a precious metal, said nickel providing a diffusion barrier between said copper and said precious metal.

16. The electrical assembly of claim 15 wherein said precious metal is gold.

17. The electrical assembly of claim 11 including at least four conductor layers on said flexible portion, a first of said conductor layers being comprised of copper, a second of said conductor layers being comprised of nickel, a third of said conductor layers being comprised of palladium-nickel and a fourth of said conductive layers being comprised of a precious metal.

18. The electrical assembly of claim 19 wherein said precious metal is gold.

19. The electrical assembly of claim 1 wherein said second circuit member includes a conductive plane as part thereof, said circuit means being electrically connected to said conductive plane.

20. An information handling system comprising an electrical assembly including a first circuit member including a circuitized substrate having first and second layers of circuitry as part thereof and at least one conductive pin projecting from said substrate and including first and second conductive portions electrically coupled to said first and second layers of circuitry, respectively, said second conductive portion being coaxially positioned about said first conductive portion to substantially reduced electrical interference between said pin and adjacent pins during operation of said system, and a second circuit member for being electrically coupled to said first circuit member and including a dielectric substrate having an opening therein and circuit means located on or within said dielectric substrate and including first and second flexible portions extending at least partly across said opening at spaced-apart locations therein, said first and second flexible portions of said circuit means adapted for frictionally and electrically engaging said first and second conductive portions of said conductive pin, respectively, when said pin is positioned within said opening of said second circuit member to provide said electrical coupling between said first and second circuit members.

* * * * *